(12) United States Patent
Petitjean

(10) Patent No.: US 12,166,303 B2
(45) Date of Patent: Dec. 10, 2024

(54) CONDUCTOR CONNECTION DEVICE AS WELL AS PRINTED CIRCUIT BOARD AND UTILITY METER COMPRISING SAME

(71) Applicant: Landis+Gyr AG, Cham (CH)

(72) Inventor: Pascal Petitjean, Montlucon (FR)

(73) Assignee: Landis+Gyr AG, Cham (CH)

( * ) Notice: Subject to any disclaimer, the term of this patent is extended or adjusted under 35 U.S.C. 154(b) by 268 days.

(21) Appl. No.: 17/839,893

(22) Filed: Jun. 14, 2022

(65) Prior Publication Data

US 2022/0352661 A1    Nov. 3, 2022

Related U.S. Application Data

(63) Continuation of application No. 16/972,206, filed as application No. PCT/IB2019/054402 on May 28, 2019, now Pat. No. 11,394,144.

(30) Foreign Application Priority Data

Jun. 6, 2018  (CH) .......................................... 724/18

(51) Int. Cl.
| | |
|---|---|
| *H01R 12/71* | (2011.01) |
| *G01R 22/06* | (2006.01) |
| *H01R 4/36* | (2006.01) |
| *H01R 12/58* | (2011.01) |

(52) U.S. Cl.
CPC ......... *H01R 12/716* (2013.01); *G01R 22/065* (2013.01); *H01R 4/36* (2013.01); *H01R 12/58* (2013.01)

(58) Field of Classification Search
CPC ...... H01R 9/2416; H01R 4/305; H01R 4/304; H01R 4/36; H01R 4/301; H01R 12/515
See application file for complete search history.

(56) References Cited

U.S. PATENT DOCUMENTS

| | | |
|---|---|---|
| 4,070,086 A | 1/1978 | Trafford |
| 5,203,716 A | 4/1993 | Martucci et al. |
| (Continued) | | |

FOREIGN PATENT DOCUMENTS

| | | |
|---|---|---|
| CN | 202172147 U | 3/2012 |
| CN | 203013974 U | 6/2013 |
| (Continued) | | |

OTHER PUBLICATIONS

Office Action, Chinese Patent Application No. 201980038090.4, Jan. 27, 2022, 17 pages.

(Continued)

*Primary Examiner* — Truc T Nguyen
(74) *Attorney, Agent, or Firm* — Kilpatrick Townsend & Stockton LLP

(57) ABSTRACT

A conductor connection device with a contact element at one side thereof, a printed circuit board with the conductor connection device, and a utility meter with the printed circuit board are provided. In order to reduce production costs of the conductor connection device without increasing the production costs of the printed circuit board or the utility meter and without affecting operational safety, the conductor connection device comprises a conductor clamping element that is accessible via the second side thereof, and the printed circuit board comprises a through-hole that is aligned with the conductor clamping element.

16 Claims, 4 Drawing Sheets

(56) References Cited

U.S. PATENT DOCUMENTS

| | | | |
|---|---|---|---|
| 6,059,605 A * | 5/2000 | Robinson | H01R 9/2491 439/146 |
| 7,397,652 B2 * | 7/2008 | Price | H02B 1/52 324/156 |
| 8,105,118 B2 | 1/2012 | Claprood, Jr. | |
| 10,312,606 B1 | 6/2019 | Wu | |
| 2006/0010997 A1 * | 1/2006 | Nathan | G01D 4/02 73/866.1 |
| 2006/0030207 A1 | 2/2006 | Mertz et al. | |
| 2008/0129538 A1 | 6/2008 | Vaswani et al. | |
| 2008/0176457 A1 | 7/2008 | Stadler et al. | |
| 2010/0081341 A1 | 4/2010 | Wu | |
| 2010/0173531 A1 * | 7/2010 | Holste | H01R 4/4821 439/700 |
| 2015/0194745 A1 * | 7/2015 | Moser | H01R 4/48365 439/55 |
| 2020/0343667 A1 * | 10/2020 | Geske | H01R 13/621 |
| 2021/0341322 A1 | 11/2021 | Pilegaard et al. | |

FOREIGN PATENT DOCUMENTS

| | | | |
|---|---|---|---|
| CN | 203037704 U | 7/2013 | |
| CN | 203644986 U | 6/2014 | |
| CN | 204257861 U | 4/2015 | |
| DE | 102009019699 A1 | 11/2010 | |
| DE | 102014103562 A1 | 9/2015 | |
| FR | 2667990 * | 4/1992 | H01R 4/36 |
| FR | 2667990 A1 | 4/1992 | |
| JP | 2002-280700 A | 9/2002 | |
| WO | 1998/10299 A1 | 3/1998 | |
| WO | 2009/082734 A1 | 7/2009 | |

OTHER PUBLICATIONS

Non-Final Office Action, U.S. Appl. No. 16/972,206, filed Nov. 10, 2021, 10 pages.

Notice of Allowance, U.S. Appl. No. 16/972,206, filed Mar. 23, 2022, 6 pages.

International Preliminary Report on Patentability, PCT Patent Application No. PCT/IB2019/054402, Sep. 1, 2020, 24 pages.

International Search Report and Written Opinion PCT Patent Application No. PCT/IB2019/054402, Sep. 5, 2019, 12 pages.

Written Opinion of the International Preliminary Examining Authority, PCT Patent Application No. PCT/IB2019/054402, Apr. 30, 2020, 8 pages.

Office Action, European Patent Application No. 19740057.5, Feb. 3, 2023, 10 pages.

* cited by examiner

CONDUCTOR CONNECTION DEVICE AS WELL AS PRINTED CIRCUIT BOARD AND UTILITY METER COMPRISING SAME

RELATED APPLICATION

This application is a continuation of U.S. application Ser. No. 16/972,206 filed Dec. 4, 2020, which is incorporated herein by reference.

The present invention relates to a conductor connection device for connecting an electrical conductor to a printed circuit board, comprising a main body having a conductor receptacle accessible through a conductor receiving opening for inserting a section of a conductor, for example a line or wire, into the conductor receptacle, the conductor receiving opening being arranged at a first outer side of the main body, a contact element adapted to electrically and/or mechanically connect the main body to a printed circuit board, the contact element being arranged at a second outer side of the main body, and a conductor clamping element adapted to clamp a section of the conductor within the conductor receptacle, wherein the conductor clamping element is accessible, i.e. operable, via the second outer side of the main body.

Furthermore, the invention relates to a printed circuit board for a utility meter, comprising a conductor connection device.

Moreover, the invention relates to a utility meter comprising a conductor connection device and/or a printed circuit board.

TECHNOLOGICAL BACKGROUND

Utility meters, for example electricity meters, are known from the prior art and serve for determining the amount of consumption of a medium, like water or gas, or of electrical energy supplied. In order to connect the utility meter to a power supply or to a source of electrical energy to be supplied and metered, the utility meter comprises the conductor connection device.

For instance, WO 98/10299 A1 relates to an electronic meter for automatic meter reading, comprising several PCBs for metering and communication interface management as well as respective communication modules. FR 2 667 990 A1 and DE 10 2014 103562 A1 relate to connection clamps to be mounted to a printed circuit board (PCB) and having contact elements for electrically contacting the PCB which are arranged at the same sides as actuation openings for accessing conductor clamping elements.

Conductor connection devices are commonly used to electrically connect an electrical conductor, e.g. a line or a wire, to an apparatus and for example to a utility meter. Conductor connection devices need to be cheap and in particular are meant to facilitate making the connection to the conductor. In use, conductor connection devices conduct electricity and need to comprise an insulating housing to protect users, for example operators or installers of the utility meter, from the electricity. However, due to the requirements to the housing, known conductor connection devices are expensive to mount and manufacture.

DESCRIPTION OF THE INVENTION

It is an object of the present invention, to at least partly mitigate some of the above-mentioned disadvantages of utility meters and their conductor connection devices known from the prior art. In particular, an object underlying the invention is to provide a conductor connection device that can be manufactured and mounted at reasonable costs without compromising electrical safety of the utility meter.

For the above-mentioned conductor connection device, the object is achieved according to the present invention in that a transition zone protrudes from the second outer side of the main body, and that a shoulder surface for supporting the conductor connection device at the printed circuit board is formed at the transition zone and faces in the same direction as the second outer side. The object is achieved according to the invention for the printed circuit board in that the conductor connection device is a conductor connection device according to the present invention. Furthermore, the object is achieved according to the present invention for the utility meter in that the conductor connection device is a conductor connection device according to the invention and/or the printed circuit board is a printed circuit board according to the invention.

Due to the accessibility of the clamping element via the second outer side, which also comprises the contact element, a user of the conductor connection device can readily operate the conductor clamping device from the second outer side that faces the printed circuit board. Hence, the printed circuit board can separate the user from the conductor connection device and may, thus, act as an insulating element that prevents physical contact between the user and the conductor connection device, such that an additional housing for the conductor connection device may not be required.

Unless explicitly stated to the contrary, the solutions according to the invention can be combined as desired and further improved by the further following embodiments that are advantages on their own, in each case.

According to a possible embodiment, the first outer side differs from the second outer side. An advantage of this embodiment may be that different functions of the conductor connection device are accessible from different sides, i.e. the receiving function of the conductor receptacle is accessible from the first outer side, whereas the operating function of the conductor clamping element is accessible from the second outer side.

According to a possible embodiment, the main body further comprises a clamping element receptacle in which the conductor clamping element is arranged in a movable manner, wherein the clamping element receptacle at least partly intersects the conductor receptacle. An advantage of this embodiment may be that the clamping element receptacle may guide the movement of the clamping element.

According to a possible embodiment, the clamping element receptacle has a clamping element opening arranged at the second outer side. An advantage of this embodiment may be that the clamping element is readily accessible via the clamping element opening at the second outer side.

According to another possible embodiment, the conductor receptacle and the clamping element receptacle together at least partly define an inner space of the main body, which inner space extends from the second outer side to the conductor receiving opening. An advantage of this embodiment may be that due to the continuous inner space formed by the conductor receptacle and the clamping element receptacle, the conductor and the conductor clamping element can be readily brought into positions, in which a projection of the conductor clamping element along the clamping element receptacle overlaps the conductor in the conductor receptacle, such that the conductor clamping element merely needs to be moved along the clamping element receptacle in order to simply clamp the conductor.

According to another possible embodiment, the contact element surmounts the main body perpendicular to the second outer side. The contact element may be affixed to the second outer side or to another outer side of the main body and may extend perpendicular to the second outer side with its free end facing away from the main body. For example, the contact element may protrude from the second outer side. An advantage of this embodiment may be that the contact element may be formed as a contact pin, which can easily be connected to another conductor or to an electronic device like the printed circuit board, for example by soldering. Alternatively, the contact element may be a contact pad arranged on the second outer side.

According to another possible embodiment, the contact element and the main body are formed out of a single piece of metal or the contact element is affixed to the main body such that the contact element and the main body and optionally also the clamping element are adapted to be handled as a single piece. An advantage of this embodiment may be that the conductor connection device can be handled and mounted easily.

According to another possible embodiment, the conductor connection device comprises at least two contact elements arranged at the second outer side, wherein the conductor clamping element is arranged between the two contact elements. An advantage of this embodiment may be that the arrangement of the clamping element between the contact elements improves absorption of forces that seek to move the main body when operating, i.e. moving, the clamping element, in particular in case the contact elements not only conductively connect, but also mechanically affix the conductor connection device to another electronic device, e.g. the printed circuit board.

According to another possible embodiment, the contact element is embodied as a stud or peg. An advantage of this embodiment may be that the conductor connection device can easily be connected to a counter contact element, wherein the contact element defines the position of the conductor connection device, in particular if the counter contact element is at least partly formed complementary to the contact element.

According to another possible embodiment, the contact element is adapted to be soldered to the printed circuit board and/or a component thereof. An advantage of this embodiment may be that the conductor connection device can easily be mounted and at the same time electrically connected to the printed circuit board.

According to another possible embodiment, the clamping element is embodied as a setscrew or grub screw. An advantage of this embodiment may be that in order to clamp the conductor, the clamping element can simply be screwed in the clamping element receptacle. Furthermore, clamping forces that clamp the conductor result in counterforces that act on the thread of the setscrew or grub screw and a counter thread that may be formed by the clamping element receptacle, which counterforces prevent that the setscrew or grub screw loosens the force-fit screw connection and, hence, secure that force fit by which the conductor is clamped.

According to a possible embodiment of the printed circuit board, the conductor connection device is mounted to the printed circuit board, such that a contact element of the conductor connection device is electrically connected to a counter contact element of the printed circuit board, wherein the printed circuit board comprises a through-hole that is essentially aligned with the conductor clamping element for accessing the conductor clamping element via the though-hole. An advantage of this embodiment may be that although the conductor connection device is arranged on one side of the printed circuit board, the clamping element is readily accessible via the through-hole from the opposite side of the printed circuit board, thereby effectively preventing unintended contact between the conductor connection device and the user.

According to a possible embodiment of the printed circuit board, the printed circuit board comprises at least two counter contact elements, wherein the through-hole is arranged between the two counter contact elements. An advantage of this embodiment may be that the arrangement of the through-hole between the counter contact elements improves absorption of forces that seek to move the main body when operating, i.e. moving, the clamping element.

According to a possible embodiment of the utility meter, the printed circuit board comprises a mounting side for mounting at least selected electrical components of the utility meter, and an operation side that faces a user of the utility meter, the mounting side and the operating side facing away from each other, wherein the conductor connection device is mounted to the mounting side and the conductor clamping element is accessible through the through access hole via the operation side. An advantage of this embodiment may be that the printed circuit board prevents or at least impedes direct contact of a user to the conductor connection device, which improves operational safety of the utility meter.

BRIEF DESCRIPTION OF THE DRAWINGS

The invention will be described hereinafter in more detail and in an exemplary manner using advantageous embodiments and with reference to the drawings. The described embodiments are only possible configurations in which, however, the individual features as described above can be provided independent of one another or can be omitted in the drawings.

WAYS OF EXECUTING THE INVENTION

Figure 1:
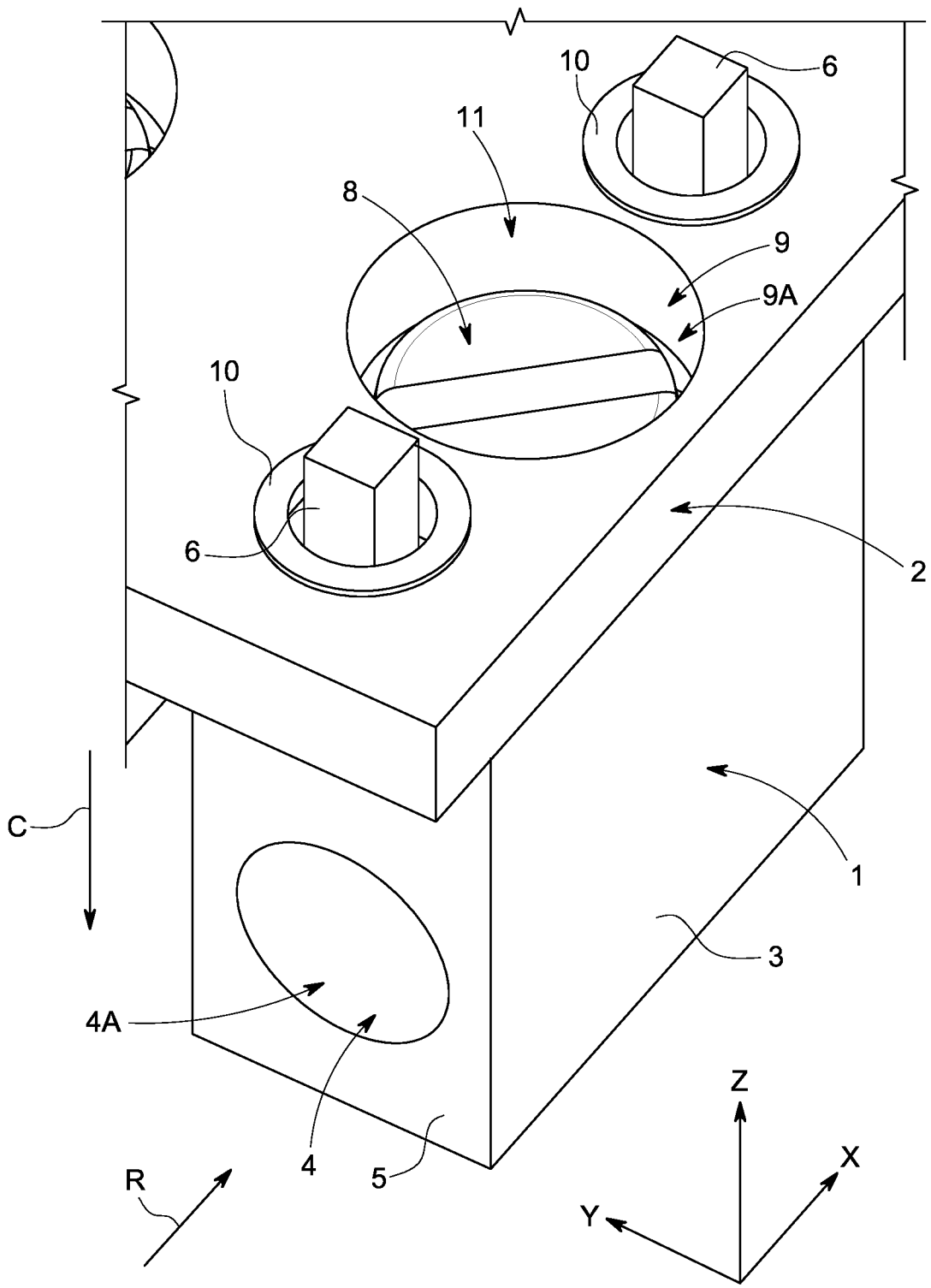
FIG. 1 shows an exemplary embodiment of a conductor connection device according to the present invention mounted to an exemplary embodiment of a printed circuit board according to the present invention in a schematic perspective view.

FIG. 1 shows an exemplary embodiment of a conductor connection device 1 according to the present invention mounted to a printed circuit board 2 according to the present invention in a schematic perspective view. The connection device 1 extends along a longitudinal direction X, a transverse direction Y, and a height direction Z, together constituting a Cartesian coordinate system. The conductor connection device 1 has a main body 3 with a conductor receiving opening 4 for introducing a section of a conductor into a conductor receptacle 4A in a receiving direction R. Hence, the conductor receptacle 4A is accessible through the conductor receiving opening 4. The receiving opening 4 opens against the receiving direction R in a first outer side 5 of the main body 3. The first outer side 5 may essentially extend perpendicular to the receiving direction R.

The conductor connection device 1 comprises at least one contact element 6 that is adapted to electrically and/or mechanically connect the main body 3 to the printed circuit board 2. The contact element 6 is arranged at a second outer side 7 of the main body 3, wherein the second outer side 7 is for the most part covered by the printed circuit board 2 in the view of FIG. 1. The second outer side 7 may differ from the first outer side 5 and may for example extend parallel to the receiving a direction R. In the exemplary embodiment of FIG. 1, the conductor connection device 1 comprises two contact elements 6. The two contact elements 6 may be arranged after each other in the receiving a direction R.

The conductor connection device 1 furthermore comprises a conductor clamping element 8. The conductor clamping 8 is adapted to clamp a section of the conductor within the conductor receptacle 4A, i.e. in case the conductor is arranged in the conductor receptacle 4A, wherein the conductor clamping element 8 is adapted to press the section of the conductor against an inner wall of the conductor receptacle 4A. In case the conductor connection device 1 comprises at least two contact elements 6, the conductor clamping element 8 and/or the conductor receiving opening 4 may be arranged between the at least two contact elements 6, for example along the receiving a direction R.

For example, the conductor clamping element 8 may be formed as an elastic clamping element with at least one latching device, and may span the main body 3. However, in FIG. 1, the conductor clamping element 8 is exemplary shown as a setscrew, grub screw or headless screw.

In particular if the conductor clamping element 8 is a setscrew or headless screw, but also if the conductor clamping element 8 is formed differently and for example as the elastic clamping element with the at least one latching device, the main body 3 may comprise a clamping element receptacle 9A, within which the conductor clamping element 8 is at least partly or even completely arranged in a movable manner. The clamping element receptacle 9A opens in the second outer side 7 with a clamping element opening 9 and extends from the clamping element opening 9 in the second outer side 7 to the conductor receptacle 4A. If the conductor connection device 1 comprises at least two contact elements 6, the clamping element opening 9 may be arranged between the at least two contact elements 6, for example along the receiving direction R.

In particular, the conductor clamping element 8 may be movable in and can optionally also be rotatable around a rotational axis extending essentially in parallel to a clamping direction C, which may essentially extend perpendicular to the receiving direction R, perpendicular to the second outer side 7 and/or parallel to the first outer side 5. For example, in order to move the conductor clamping element 8 in the clamping direction C, the clamping element receptacle 9A may extend along the clamping direction C. In the present embodiment, the receiving direction R extends along the longitudinal direction X, and the clamping direction C extends along the height direction Z.

The printed circuit board 2 may be a printed circuit board for a utility meter and comprises the conductor connection device 1. For example, the printed circuit board 2 comprises a counter contact element 10, to which one of the contact elements 6 is electrically and/or mechanically connected. The counter contact element 10 may be a contact pad of the printed circuit board 2, which is exemplarily shown having a ring-shape surrounding a vertical interconnect access hole of the printed circuit board 2.

The printed circuit board 2 may comprise a through-hole 11, via which the conductor clamping element 8 is accessible. The through-hole 11 may be aligned with the conductor clamping element 8 and/or the clamping element receptacle 9A and/or the clamping element opening 9. The printed circuit board 2 may comprise two counter contact elements 10, wherein the through hole 11 may be arranged between the two counter contact elements 10.

In the exemplary embodiment of FIG. 1, the at least one contact element 6 surmounts the main body 3 perpendicular to the second outer side 7 and may protrude from the second outer side 7. For example, the at least one contact element 6 is formed as a contact pin. Alternatively, the at least one contact element 6 may be formed as a contact pad that can be arranged on and/or be essentially flush with the second outer side 7.

The at least one contact element 6 and the main body 3 may be adapted to be handled as a single piece. For example, the at least one contact elements 6 or all of the contact elements 6 and the main body 3 may be formed out of a single piece of metal or the at least one contact element 6 or all of the contact elements 6 may be affixed to the main body 3, for example by welding or soldering. In case the at least one contact element 6 or all of the contact elements 6 are formed as contact pads, the at least one contact element 6 or all of the contact elements 6 can be coated onto the second outer side 7.

Figure 2:
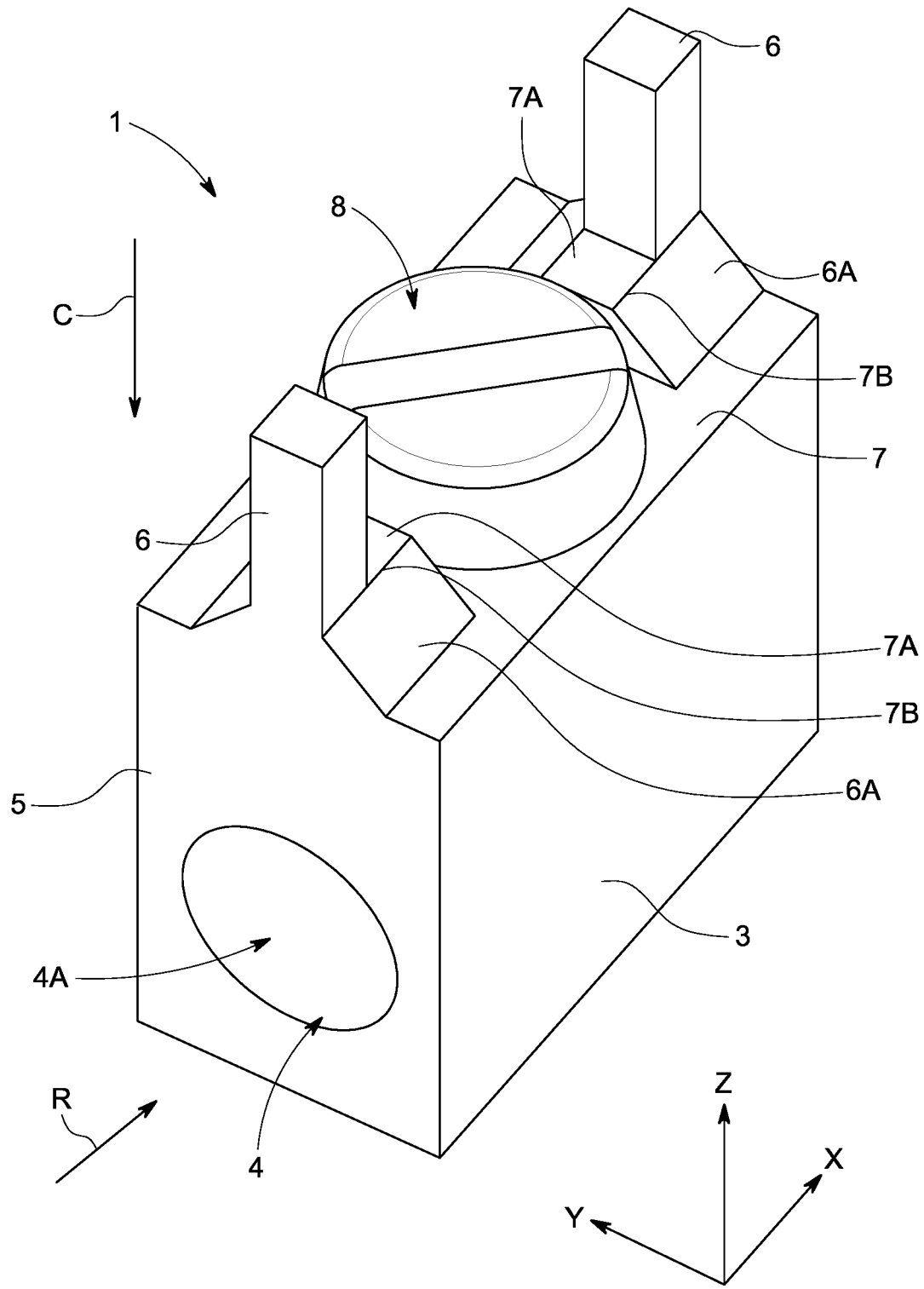
FIG. 2 shows the exemplary embodiment of the conductor connection device illustrated in FIG. 1 in a schematic perspective view.

FIG. 2 shows the exemplary embodiment of the conductor connection device 1 illustrated in FIG. 1 in a schematic perspective view. Here it becomes apparent that a transition zone 6A protrudes from the second outer side 7 of the main body 3 in a direction opposite to the clamping direction C. A shoulder surface 7A is formed at the transition zone 6A and faces in the same direction as the second outer side 7. The shoulder surface 7A serves for supporting the conductor connection device 1 at the printed circuit board 2. According to the present exemplary embodiment, the transition zone 6A is formed as a lug or projection which tapers in a direction opposite to the clamping direction C. Both, the contact element 6 and a small platform or step 7B, a flat top of which essentially constitutes the shoulder surface 7A, protrude from the transition zone 6A in parallel to each other in a direction opposite to the clamping direction C.

Figure 3:
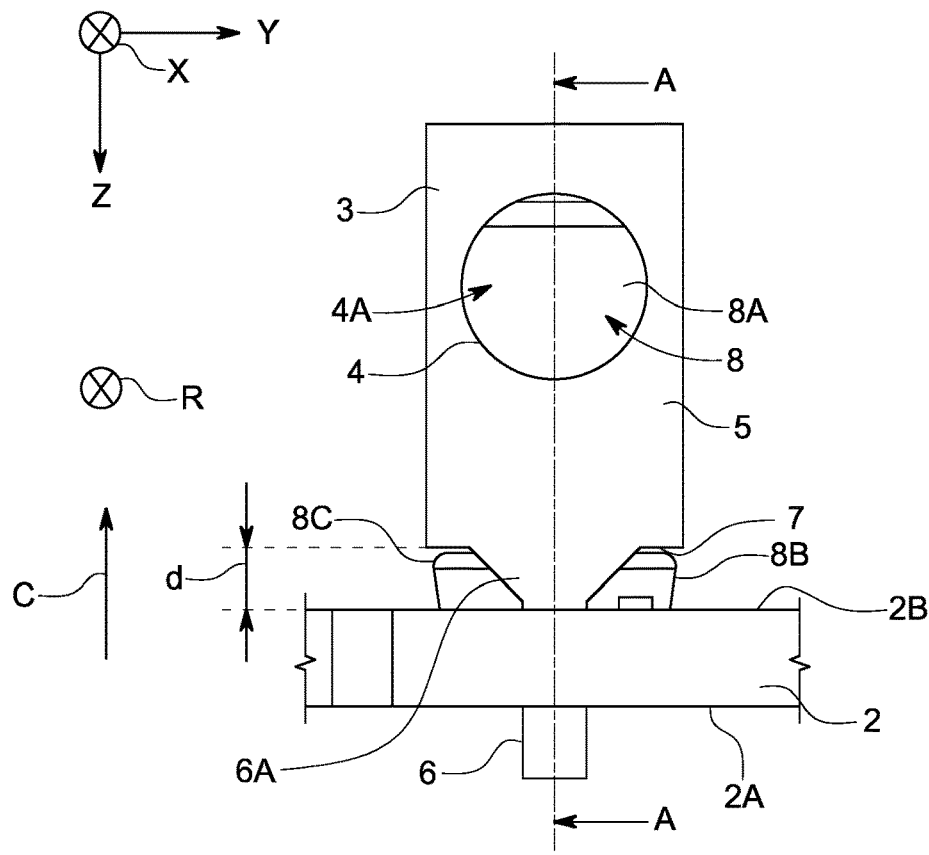
FIG. 3 shows the exemplary embodiment of the conductor connection device illustrated in FIGS. 1 and 2 in a schematic front view.

FIG. 3 shows the exemplary embodiment of the conductor connection device 1 illustrated in FIGS. 1 and 2 in a schematic front view. Here it becomes apparent that the contact element 6 juts above an upper side 2A of the printed circuit board 2 in the height direction Z, i.e. in a direction opposite to the clamping direction C. The upper side 2B faces away from the main body 3. The contact element 6 is connected to the main body 3 by the transition zone 6A. In the transition zone 6A, the contact element 6 merges with the main body 3. The transition zone 6A has a trapezoid shape in a projection along the receiving direction R. The second outer side 7 of the conductor connection device 1 is distanced from the printed circuit board 2 by a distance d which is measured in parallel to the height direction Z, and/or the clamping direction C, respectively, and is essentially bridged by the transition zone 6A.

The conductor clamping element 8 is accessible through a gap having the width of the distance d between a lower side 2B of the printed circuit board 2 and the second outer side 7 of the main body 3. The upper side 2A and the lower side 2B face away from each other and are opposite sides of the printed circuit board 2. The clamping element 8 comprises a clamping portion 8A, an actuation portion 8B, and an abutment section 8C. The clamping portion 8A may be arranged within the main body 3 of the conductor connection device 1, such that at least partly overlaps with the conductor receiving opening 4 and/or the conductor receptacle 4A in a projection along the receiving direction R. The actuation portion 8B is arranged behind the main body 3 in the height direction Z, i.e. in a direction against the clamping direction C.

Figure 4:
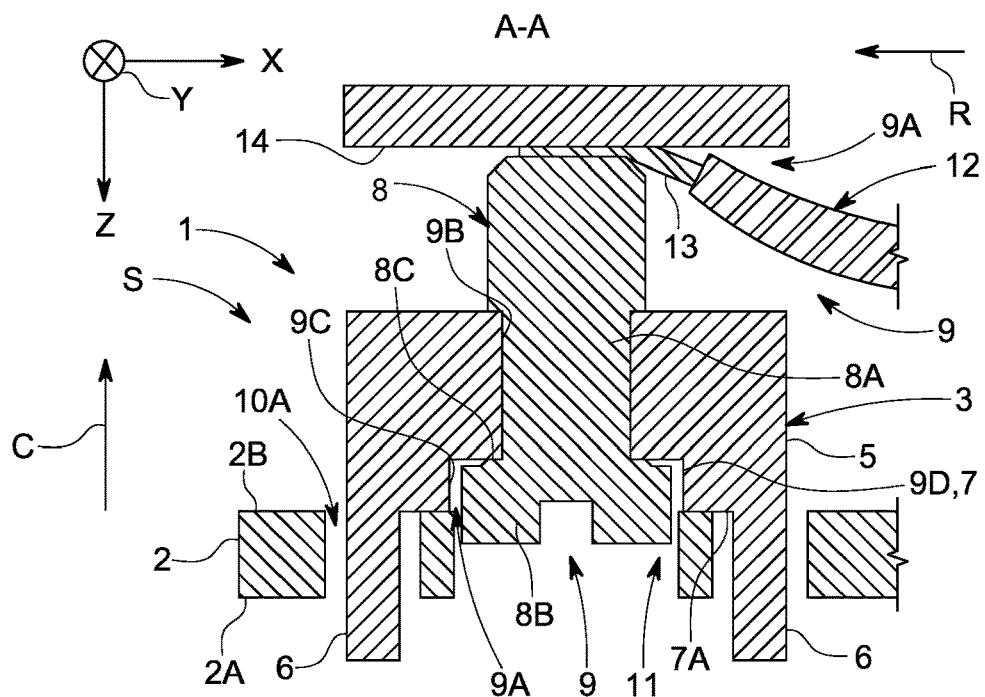
FIG. 4 shows the exemplary embodiment of the conductor connection device illustrated in FIGS. 1 to 3 in a schematic cross-sectional view along the cross-sectional line A-A depicted in FIG. 3.

FIG. 4 shows the exemplary embodiment of the conductor connection device 1 illustrated in FIGS. 1 to 3 in a schematic cross-sectional view along a cross-sectional line A-A depicted in FIG. 3, and with a conductor connected to the conductor connection device 1. The cross-sectional plane extends along the receiving a direction R and the clamping direction C. In addition to the conductor connection device 1, a conductor 12 is shown. The conductor 12 may be a line or wire. A bare or stripped end 13 of the conductor 12 is at least partly inserted via the receiving opening 4 into conductor receptacle 4A in the receiving direction R. In the clamping direction C, the bare end 13 of the conductor 12 is arranged between the conductor clamping element 8, in particular a lower end of the clamping portion 8A, facing the clamping direction C, and an inner wall 14 of the main body 3. The inner wall 14 may be arranged behind to the clamping element opening 9A the clamping direction C and may at least sectionwise delimit the receiving opening 4 in the clamping direction C.

The clamping portion 8A of the conductor clamping element 8 is held at an engagement portion 9B of the clamping element receptacle 9A such that it is supported in a direction opposite to the clamping direction C, for example in that the clamping portion 8A and the engagement portion 9B are threaded in a complementary manner. The actuation portion 8B of the conductor clamping element 8 is at least partly accommodated in a socket portion 9C of the clamping element receptacle 9A formed between the transition zones 6A. The abutment section 8C of the conductor clamping element 8 abuts a bottom 9D of the socket portion 9C in the clamping direction C. According to the present exemplary embodiment, the bottom 9D is constituted by a part of the second outer surface 7. The abutment section 8C is e.g. formed as a shoulder or ledge at the conductor clamping element 8 and acts as a limit stop for any movement of the conductor clamping element 8 in the clamping direction C. Thereby, a clearance between the conductor clamping element 8, in particular the clamping portion 8A thereof, and the inner wall 14 of the main body 3 may be provided for avoiding an excessive deformation of the bare end 13 of the conductor 12.

Furthermore, the main body 3, in particular the shoulder surface 7A thereof, rests on the lower side 2B of the printed circuit board 2. While the conductor connection device 1 is thus supported on the printed circuit board 2, the contact elements 6 extend through contact receptacles 10A provided within the printed circuit board 2 in the form of pin-in-holes. The contact receptacles 10A are dimensioned such that the counter contact elements 10 essentially fill up the circumferential space between the contact elements 6 and the contact receptacles 10A. The socket portion 9C is dimensioned such that the conductor clamping element 8, in particular the actuation portion 8B thereof, is embedded within a space constituted by the socket portion 9C and the through-hole 11 of the printed circuit board 2. In other words, in a clamping position S shown in FIG. 4, the conductor clamping element 8 is moved beyond the upper side 2A of the printed circuit board 2.

Figure 5:
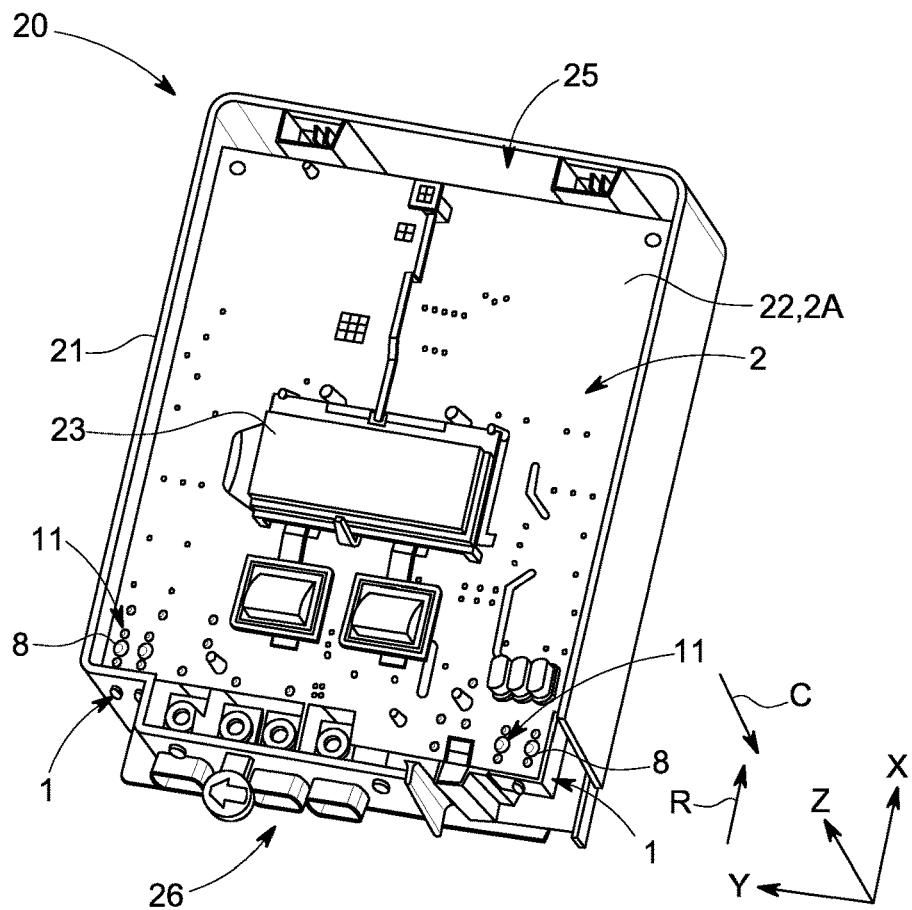
FIG. 5 shows an exemplary embodiment of a utility meter according to the present invention in a schematic perspective view in a pre-assembled state.

FIG. 5 shows an exemplary embodiment of a utility meter 20 according to an embodiment of the present invention, for example for metering electricity supplied to a facility or to a home, in a pre-assembled state A. The utility meter 20 comprises the printed circuit board 2, wherein the conductor connection device 1 is mounted to a side of the printed circuit board 2. Mounting the conductor connection device 1 to the printed circuit board 2 may mean that the conductor connection device 1 is arranged on said side of the printed circuit board 2. The conductor connection device 1 may be affixed to the printed circuit board 2 and for example at the side it is mounted to.

The printed circuit board 2 may have a mounting side for mounting at least selected electrical components of the utility meter 20. The conductor connection device 1 may be mounted to the mounting side. In particular, the main body 3 may be provided at the mounting side. In the exemplary embodiment shown in FIG. 5, the mounting side faces into a housing 21 of the utility meter 20, such that the mounting side is not visible. Furthermore, the printed circuit board 2, when arranged in the housing 21, may comprise an operation side 22 that faces out of the housing 21 and in particular faces a user or an installer of the utility meter 20. In the present embodiment, the upper side 2A of the printed circuit board 2 is designated as the operation side 22. The conductor clamping element 8 is accessible through the through-hole 11 via the operation side 22, i.e. the upper side 2A of the printed circuit board 2.

In the exemplary embodiment shown in FIG. 5, additional components, for example of a user interface comprising a display 23 and buttons 24 are arranged on the operation side 22 of the printed circuit board 2. The housing 21 comprises a front opening 25 that opens the housing 21 towards a user or an installer, such that the user or installer can access the printed circuit board 2 in the clamping direction C via the front opening 25. The operation side 22 faces the user through the front opening 25. Hence, the front opening 25 may extend perpendicular to the clamping direction C. Additionally or alternatively, the housing 21 may comprise a connection opening 26 for connecting the utility meter 21 to the conductor 12 via the connection opening 26. The conductor receiving opening 4 may face the connection opening 26. Thus, the connection opening 26 may extend perpendicular to the receiving direction R. The front opening 25 and the connection opening 26 may be formed continuously.

Figure 6:
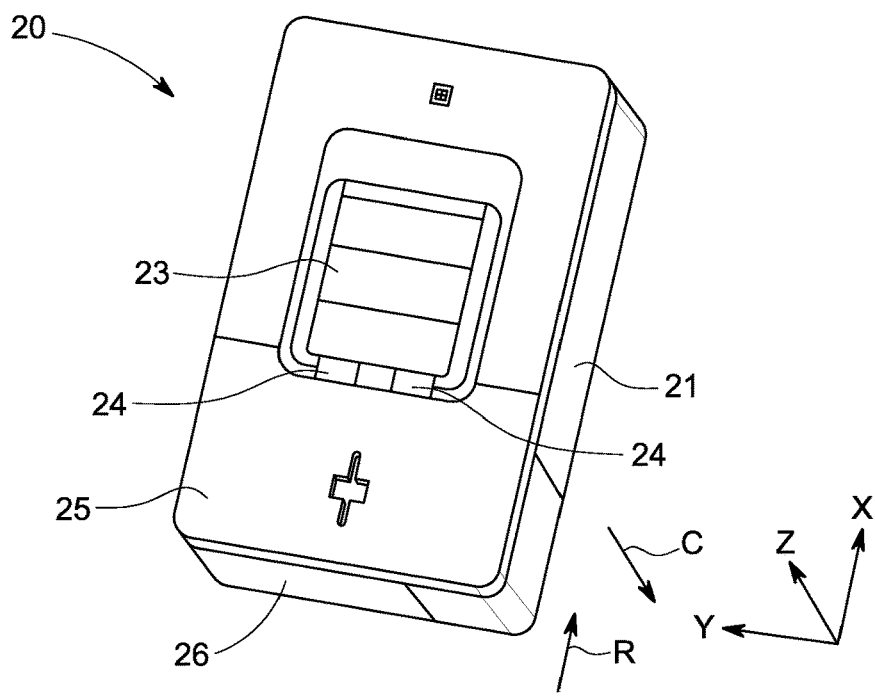
FIG. 6 shows the utility meter illustrated in FIG. 5 in a fully assembled state.

FIG. 6 shows the utility meter 20 of the exemplary embodiment shown in FIG. 5 in a fully assembled state B, in which the housing 21 of the utility meter 20 is closed by a lid 27. The lid 27 may be adapted to close the front opening 25 of the housing 21 that faces away from the mounting side of the printed circuit board 2. Additionally, the lid 27 may be adapted to close the connection opening 26 in the completely assembles state of the utility meter 20.

Deviations from the above-described embodiments are possible without departing from the scope of the present invention. The conductor connection device 1 and the printed circuit board 2 may be formed as required for connecting a conductor 12, such as a line, cable, wire, or alike, to the printed circuit board 2.

The conductor connection device 1 may therefore comprise a main body 3 with conductor receiving openings 4, conductor receptacles 4A, first outer side 5, contact elements 6, transition zones 6A, second outer sides 7, shoulder surfaces 7A, conductor clamping elements 8 with clamping portions 8A, actuation portions 8B and/or abutment sections 8C, clamping element openings 9 to clamping element receptacles 9A, comprising engagement portions 9B, socket portions 9C, and/or bottoms 9D, inner walls 14, in any number and form required for connecting a conductor 12 to the printed circuit board 2 in line with the present invention.

The printed circuit board 2 may therefore analogously comprise upper sides 2A, lower sides 2B, counter contact elements 10, contact receptacles 10A, through-holes 11, and/or operation side 22 and any number and form required for supporting and mounting a conductor connection device 1 for connecting a conductor 12 to the printed circuit board tool in line with the present invention. The utility meter 20 may comprise conductor connection devices 1, printed circuit boards 2, housings 21, displays 23, buttons 24, front openings 25, connection openings 26, and/or lids 27 and any number and form required.

REFERENCE SIGNS

| | |
|---|---|
| 1 | conductor connection device |
| 2 | printed circuit board |
| 2A | upper side |
| 2B | lower side |
| 3 | main body |
| 4 | conductor receiving opening |
| 4A | conductor receptacle |
| 5 | first outer side |
| 6 | contact element |
| 6A | transition zone |
| 7 | second outer side |
| 7A | shoulder surface |
| 7B | step |
| 8 | conductor clamping element |
| 8A | clamping portion |
| 8B | actuation portion |
| 8C | abutment section |
| 9 | clamping element opening |
| 9A | clamping element receptacle |
| 9B | engagement portion |
| 9C | socket portion |
| 9D | bottom |
| 10 | counter contact elements of the printed circuit board |
| 10A | contact receptacle |
| 11 | through-hole of printed circuit board |
| 12 | conductor |
| 13 | bare end of conductor |
| 14 | inner wall of the main body |
| 20 | utility meter |
| 21 | housing of utility meter |
| 22 | operation side |
| 23 | display |
| 24 | button |
| 25 | front opening |
| 26 | connection opening |
| 27 | lid |
| d | distance between second outer side and printed circuit board |
| A | pre-assembled state |
| B | fully assembled state |
| C | clamping direction |
| R | receiving direction |
| S | Clamping position |
| X | longitudinal direction |
| Y | transverse direction |
| Z | height direction |

The invention claimed is:

1. A conductor connection device for connecting an electrical conductor to a printed circuit board, comprising:

a main body having a conductor receptacle, wherein a conductor receiving opening of the conductor receptacle is arranged at a first outer side of the main body;

at least one contact element arranged at a second outer side of the main body, wherein the at least one contact element is configured to connect the main body to the printed circuit board, and the second outer side of the main body is approximately perpendicular to the first outer side of the main body, a clamping element receptacle, wherein a clamping element opening of the clamping element receptacle is arranged at the second outer side of the main body; and a conductor clamping element including a clamping portion and an actuation portion, wherein the clamping element receptacle is configured to receive at least a portion of the conductor clamping element, wherein the conductor connection device comprises two contact elements and the clamping element opening is arranged on the second outer side of the main body between the two contact elements, and wherein each of the two contact elements includes a transition zone that protrudes from the second outer side of the main body, and wherein a gap is formed between the second outer side of the main body and a side of the printed circuit board facing the second outer side of the main body and between the two transition zones when the main body of the conductor connection device is connected to the printed circuit board.

2. The conductor connection device according to claim 1, wherein the clamping element receptacle includes a socket portion and a bottom of the socket portion is formed by a portion of the second outer side of the main body.

3. The conductor connection device according to claim 2, wherein the conductor clamping element includes an abutment section configured to contact the bottom of the socket portion to limit movement of the conductor clamping element in a clamping direction.

4. The conductor connection device according to claim 2, wherein the socket portion is configured to accommodate the actuation portion of the conductor clamping element.

5. The conductor connection device according to claim 1, wherein the clamping element receptacle at least partly intersects with the conductor receptacle.

6. The conductor connection device according to claim 1, wherein the conductor clamping element is a screw and the clamping element receptacle is threaded in a complementary manner to the conductor clamping element.

7. A printed circuit board, comprising:

a conductor connection device for connecting an electrical conductor to the printed circuit board, wherein the conductor connection device comprises:

a main body having a conductor receptacle, wherein a conductor receiving opening of the conductor receptacle is arranged at a first outer side of the main body;

at least one contact element arranged at a second outer side of the main body, wherein the at least one contact element is configured to connect the main body to the printed circuit board, and the second outer side of the main body is approximately perpendicular to the first outer side of the main body, a clamping element receptacle, wherein a clamping element opening of the clamping element receptacle is arranged at the second outer side of the main body; and a conductor clamping element including a clamping portion and an actuation portion, wherein the clamping element receptacle is configured to receive at least a portion of the conductor clamping element, wherein the conductor connection device comprises two contact elements and the clamping element opening is arranged on the second outer side of the main body between the two contact elements, and wherein each of the two contact elements includes a transition zone that protrudes from the second outer side of the main body, and wherein a gap is formed between the second outer side of the main body and a side of the printed circuit board facing the second outer side of the main body and between the two transition zones when the main body of the conductor connection device is connected to the printed circuit board.

8. The printed circuit board according to claim 7, further comprising at least one counter contact element to which the at least one contact element of the conductor connection device is connected.

9. The printed circuit board according to claim 7, wherein the printed circuit board has a mounting side and an operation side opposite the mounting side, the printed circuit board further comprising a through hole, wherein the conductor connection device is mounted to the mounting side of the printed circuit board, and the conductor clamping element is accessible through the through hole via the operation side of the printed circuit board.

10. The printed circuit board according to claim 9, further comprising user interface components arranged on the operation side of the printed circuit board.

11. A utility meter comprising:
a printed circuit board; and
a conductor connection device for connecting an electrical conductor to the printed circuit board, wherein the conductor connection device comprises:
a main body having a conductor receptacle, wherein a conductor receiving opening of the conductor receptacle is arranged at a first outer side of the main body;
at least one contact element arranged at a second outer side of the main body, wherein the at least one contact element is configured to connect the main body to the printed circuit board, and the second outer side of the main body is approximately perpendicular to the first outer side of the main body,
a clamping element receptacle, wherein a clamping element opening of the clamping element receptacle is arranged at the second outer side of the main body; and
a conductor clamping element including a clamping portion and an actuation portion, wherein the clamping element receptacle is configured to receive at least a portion of the conductor clamping element,
wherein the printed circuit board has a mounting side and an operation side opposite the mounting side, and wherein the conductor connection device is mounted to the mounting side of the printed circuit board, and
user interface components are arranged on the operation side of the printed circuit board.

12. The utility meter according to claim 11, further comprising:
a housing having a connection opening, wherein the conductor receiving opening of the conductor connection device faces the connection opening; and
a lid configured for closing the housing.

13. The utility meter according to claim 12, wherein the lid is adapted to close the connection opening when the lid and housing are assembled.

14. The utility meter according to claim 12, wherein the printed circuit board has a mounting side and an operation side opposite the mounting side, and wherein the conductor connection device is mounted to the mounting side of the printed circuit board, and the conductor clamping element is accessible through a through hole in the printed circuit board via the operation side of the printed circuit board when the lid is removed.

15. The utility meter according to claim 14, wherein the conductor connection device comprises two contact elements and the printed circuit board comprises two counter contact elements, and the through hole is arranged between the two counter contact elements in the printed circuit board.

16. The utility meter according to claim 11, wherein the user interface components include a display.

* * * * *